(12) United States Patent
Hanna et al.

(10) Patent No.: US 7,102,154 B2
(45) Date of Patent: Sep. 5, 2006

(54) ORGANIC SEMICONDUCTOR STRUCTURE, PROCESS FOR PRODUCING THE SAME, AND ORGANIC SEMICONDUCTOR DEVICE

(75) Inventors: Jun-Ichi Hanna, Yokohama (JP); Hiroki Maeda, Shinjuku-Ku (JP); Masanori Akada, Shinjuku-Ku (JP)

(73) Assignee: Dai Nippon Printing Co. LTD, Tokyo (JP)

( * ) Notice: Subject to any disclaimer, the term of this patent is extended or adjusted under 35 U.S.C. 154(b) by 0 days.

(21) Appl. No.: 10/502,529

(22) PCT Filed: Feb. 7, 2003

(86) PCT No.: PCT/JP03/01339

§ 371 (c)(1), (2), (4) Date: Jul. 26, 2004

(87) PCT Pub. No.: WO03/067667

PCT Pub. Date: Aug. 14, 2003

(65) Prior Publication Data

US 2005/0156161 A1    Jul. 21, 2005

(30) Foreign Application Priority Data

Feb. 8, 2002    (JP) .............................. 2002-032722

(51) Int. Cl.
  *H01L 35/24*    (2006.01)
(52) U.S. Cl. .......................................................... 257/40
(58) Field of Classification Search .................. 257/40
  See application file for complete search history.

(56) References Cited

U.S. PATENT DOCUMENTS 5,766,510 A    6/1998  Hanna et al.
5,980,779 A    11/1999 Hanna et al.
6,224,787 B1   5/2001  Hanna et al.
6,326,640 B1   12/2001 Shi et al.

FOREIGN PATENT DOCUMENTS

| EP | 0786820 A2 | 7/1997 |
| JP | 8-181364 A | 7/1996 |
| JP | 9-232589 A | 9/1997 |
| JP | 9-316442 A | 12/1997 |
| JP | 10-312711 A | 11/1998 |
| JP | 2001-75297 A | 3/2001 |

OTHER PUBLICATIONS

International Search Report for PCT/JP03/01339; ISA/JP; Mailed: Apr. 15, 2003.

*Primary Examiner*—Long Pham
(74) *Attorney, Agent, or Firm*—Harness, Dickey & Pierce, P.L.C.

(57) ABSTRACT

There are provided an organic semiconductor structure comprising an organic semiconductor layer, which is large in size and homogeneous and has high charge transfer characteristics, a process for producing the same, and an organic semiconductor device. The organic semiconductor structure has, in at least a part thereof, an organic semiconductor layer comprising an aligned liquid crystalline organic semiconductor material. The liquid crystalline organic semiconductor material comprises an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6. The liquid crystalline organic semiconductor material exhibits at least one liquid crystal state at a temperature below the heat decomposition temperature thereof.

12 Claims, 3 Drawing Sheets

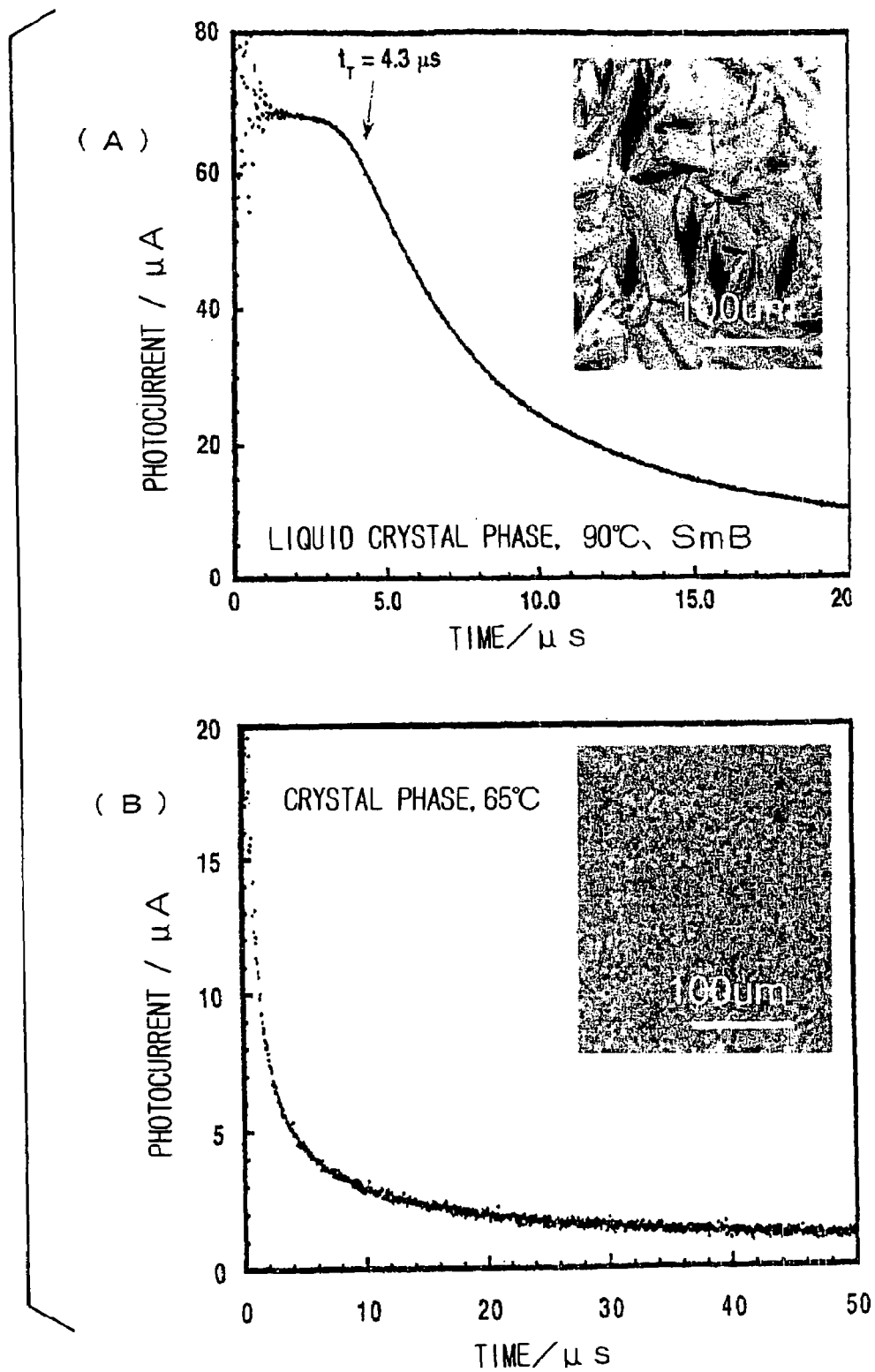
F I G. 1

ORGANIC SEMICONDUCTOR STRUCTURE, PROCESS FOR PRODUCING THE SAME, AND ORGANIC SEMICONDUCTOR DEVICE

TECHNICAL FIELD

The present invention relates to an organic semiconductor structure comprising an organic semiconductor layer formed using a liquid crystalline organic semiconductor material, a process for producing the same, and an organic semiconductor device.

BACKGROUND ART

Thin-film transistors (also known as "organic TFT") utilizing an organic semiconductor in an active layer (hereinafter referred to as "organic semiconductor layer") may be mentioned as typical elements for constituting organic semiconductor devices.

In the thin-film transistors, the organic semiconductor layer is formed by forming a film of a molecular crystal typified by pentacene in vacuo. Regarding the formation of the organic semiconductor layer by the film formation in vacuo, there is a report that the optimization of the film formation conditions can realize the formation of an organic semiconductor layer having a high level of charge mobility exceeding 1 cm$^2$/V·s (Y. -Y. Lin, D. J. Gundlach, S. Nelson, and T. N. Jackson, "Stacked Pentacene Layer Organic Thin-Film Transistors with Improved Characteristics," IEEE Electron Device Lett. 18, 606 (1997)). The organic semiconductor layer formed by the film formation in vacuo, however, is generally in a polycrystal form composed of aggregates of fine crystals. Therefore, many grain boundaries are likely to exist, and, in addition, defects are likely to occur. The grain boundaries and defects inhibit the transfer of charges. For this reason, in the formation of the organic semiconductor layer by film formation in vacuo, the organic semiconductor layer as the element for constituting the organic semiconductor device could not have been substantially continuously produced in a satisfactory wide area with homogeneous properties and without difficulties.

On the other hand, a discotic liquid crystal is known as a material having a high level of charge mobility (D. Adam, F. Closss, T. Frey, D. Funhoff, D. Haarer, H. Ringsdorf, P. Schunaher, and K. Siemensmyer, Phys. Rev. Lett., 70, 457 (1993)). In this discotic liquid crystal, however, charge transfer is carried out based on a one-dimensional charge transfer mechanism along the columnar molecular alignment. Therefore, close control of the molecular alignment is required, and this disadvantageously makes it difficult to utilize the discotic liquid crystal on a commercial scale. Any example of success in thin-film transistors using the discotic liquid crystal as a material for constituting the organic semiconductor layer has not been reported yet.

A high level of charge mobility in a liquid crystal state of rodlike liquid crystalline materials such as phenylbenzothiazole derivatives has already been reported (M. Funahashi and J. Hanna, Jpn. J. Appl. Phys., 35, L703–L705 (1996)). Up to now, however, there is no report on any example of success of thin-film transistors utilizing the rodlike liquid crystalline material in the organic semiconductor layer. The rodlike liquid crystalline material exhibits a few types of liquid crystal states, and the charge mobility is likely to increase with enhancing the regularity of the structure of the liquid crystalline material. The transition of the liquid crystalline material to a crystal state having a higher level of regularity of structure, however, results in lowered or no charge mobility. In this case, of course, no properties required of the thin-film transistor are developed.

When a molecular dispersion polymeric material is used as an organic semiconductor material, an organic semiconductor layer, which has uniform charge transfer characteristics over a large area can be formed by coating this organic semiconductor material. The organic semiconductor layer thus formed, however, has a low charge mobility of 10$^{-5}$ to 10$^{-6}$ cm$^2$/V·s, and, disadvantageously, the charge mobility depends upon temperatures and electric fields.

The present invention has been made with a view to solving the above problems of the prior art, and an object of the present invention is to provide an organic semiconductor structure comprising an organic semiconductor layer having a relatively large area and uniform and high level of charge transfer characteristics, which have hitherto been regarded as unattainable, a process for producing the same, and an organic semiconductor device.

DISCLOSURE OF THE INVENTION

The above object can be attained by an organic semiconductor structure having, in at least a part thereof, an organic semiconductor layer comprising an aligned liquid crystalline organic semiconductor material, said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material exhibiting at least one liquid crystal state at a temperature below the heat decomposition temperature thereof. According to another aspect of the present invention, there is provided an organic semiconductor structure having, in at least a part thereof, an organic semiconductor layer comprising an aligned liquid crystalline organic semiconductor material, said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material exhibiting at least a smectic liquid crystal phase state at a temperature below the heat decomposition temperature thereof. According to still another aspect of the present invention, there is provided an organic semiconductor structure having, in at least a part thereof, an organic semiconductor layer comprising an aligned liquid crystalline organic semiconductor material, said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material having, at its both ends, a terminal group capable of developing liquid crystallinity.

In an embodiment of the present invention, preferably, at least a part of said liquid crystalline organic semiconductor material in the organic semiconductor layer has been aligned and crystallized by holding the liquid crystalline organic semiconductor material at a temperature suitable for the conversion of the liquid crystalline organic semiconductor material to a liquid crystal state and then cooling the liquid crystalline organic semiconductor material.

Further, preferably, the organic semiconductor layer is stacked in contact with a liquid crystal aligning layer, and the provision of the organic semiconductor layer in contact with the liquid crystal aligning layer permits the liquid crystalline organic semiconductor material to be aligned in a specific orientation or direction. In particular, preferably, the organic semiconductor layer is stacked and aligned on a liquid crystal aligning layer formed of a polyimide material, or is stacked and aligned on a liquid crystal aligning layer formed of a cured resin having fine concaves and convexes on its surface, or is formed on a substrate formed of a cured resin having fine concaves and convexes on its surface.

According to a further aspect of the present invention, there is provided an organic semiconductor structure comprising an organic semiconductor layer and a liquid crystal aligning layer, said organic semiconductor layer comprising a liquid crystalline organic semiconductor material, which exhibits at least one liquid crystal state at a predetermined temperature below the heat decomposition temperature, and being provided in contact with the liquid crystal aligning layer, at least a part of the liquid crystalline organic semiconductor material having been aligned and crystallized.

According to the organic semiconductor structure of the present invention, the organic semiconductor layer is formed of a liquid crystalline organic semiconductor material having, at its end (either both ends or one end), a terminal structure (also known as "terminal group") capable of developing liquid crystallinity. Therefore, the molecular alignment is spontaneously realized by the self-organization of the liquid crystalline organic semiconductor material. The molecular alignment is similar to that of crystals. As a result, excellent charge transfer characteristic as in molecular crystals can be developed. Further, when a liquid crystalline organic semiconductor material having a smectic liquid crystal phase of a high order is used, an organic semiconductor layer having a very high level of crystallinity can be formed. Furthermore, the organic semiconductor material in a liquid crystal state is fluid at such a temperature that can maintain the liquid crystal state. Therefore, the organic semiconductor material can be coated in the liquid crystal state, and the coating can be then brought to the above crystal state. As a result, a large-area organic semiconductor layer having uniform charge transfer characteristics can be formed. In addition, the organic semiconductor layer formed of the liquid crystalline organic semiconductor material has a high level of crystallinity by virtue of the molecular orientation order and has a very small intermolecular distance. Therefore, excellent charge transfer characteristics derived from hopping conduction can be provided. Further, when means for aligning the liquid crystalline organic semiconductor material is properly selected, liquid crystalline molecules can be aligned in a specific direction. Therefore, functionalities and electric characteristics characteristic of the direction of the alignment can be developed.

In another aspect of the present invention, there is provided a process for producing the organic semiconductor structure, comprising the steps of: allowing said liquid crystalline organic semiconductor material to experience or be held at the liquid crystal development temperature of the liquid crystalline organic semiconductor material to once convert the liquid crystalline organic semiconductor material to a liquid crystal state; and cooling the liquid crystalline organic semiconductor material in a liquid crystal state to align and crystallize the liquid crystalline organic semiconductor material.

According to the present invention, since the liquid crystalline organic semiconductor material is a liquid crystalline material which is fluid at such a temperature that can maintain the liquid crystal state, coating of the liquid crystalline organic semiconductor material onto a layer forming face or the formation of a layer of the liquid crystalline organic semiconductor material on a layer forming face, e.g., by vapor deposition followed by conversion of the state to a liquid crystal state is easy. The organic semiconductor material in a liquid crystal state can be then gradually cooled to form a defect-free organic semiconductor layer in a crystal state which is uniform in charge transfer characteristics and large in area. In the organic semiconductor layer thus formed, the molecular alignment is spontaneously realized by the self-organization of the liquid crystalline organic semiconductor material. The molecular alignment is similar to that of crystals. As a result, excellent charge transfer characteristic as in molecular crystals can be developed.

The organic semiconductor device in another aspect of the present invention includes a substrate, a gate electrode, a gate insulating layer, an organic semiconductor layer, a drain electrode, and a source electrode. This organic semiconductor device is characterized in that the organic semiconductor layer comprises a liquid crystalline organic semiconductor material having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6. In the organic semiconductor device according to the present invention, functionalities and electric characteristics characteristic of alignment direction can be developed by specifying the direction of alignment of the liquid crystalline organic semiconductor material by means of specific means. The liquid crystalline organic semiconductor material can be aligned by forming an aligning layer on an organic semiconductor material layer forming face (hereinafter referred to as "layer forming face"; for example, the surface of a gate insulating layer), by subjecting the organic semiconductor material layer forming face to alignment treatment, or by forming the organic semiconductor material layer so as to be brought into contact with a layer subjected to alignment treatment.

In the above organic semiconductor device according to the present invention, preferably, organic semiconductor molecules constituting the liquid crystalline organic semiconductor material are aligned in a direction orthogonal to the film thickness direction of a drain electrode and a source electrode provided on the gate insulating layer and so as to be transversely arranged between the drain electrode and the source electrode. Further, preferably, organic semiconductor molecules in the liquid crystalline organic semiconductor material are aligned in parallel with the film thickness direction of a drain electrode and a source electrode provided on the gate insulating layer. According to the above constructions, liquid crystalline molecules in the liquid crystalline organic semiconductor material can be aligned in a specific orientation or direction, and functionalities and electric characteristics characteristic of the direction of the alignment can be developed.

In the organic semiconductor device according to the present invention, preferably, the organic semiconductor material has smectic liquid crystallinity at a predetermined temperature below the heat decomposition temperature of the organic semiconductor material and has a charge mobility of not less than $10^{-5}$ cm$^2$/V·s or a hole transport mobility of not less than $10^{-5}$ cm$^2$/V·s.

BRIEF DESCRIPTION OF THE DRAWINGS

FIG. 1 is a diagram showing the results of measurement of photoconductivity of an organic semiconductor layer formed by providing an organic semiconductor material on a substrate not subjected to alignment treatment;

BEST MODE FOR CARRYING OUT THE INVENTION

Figure 2:
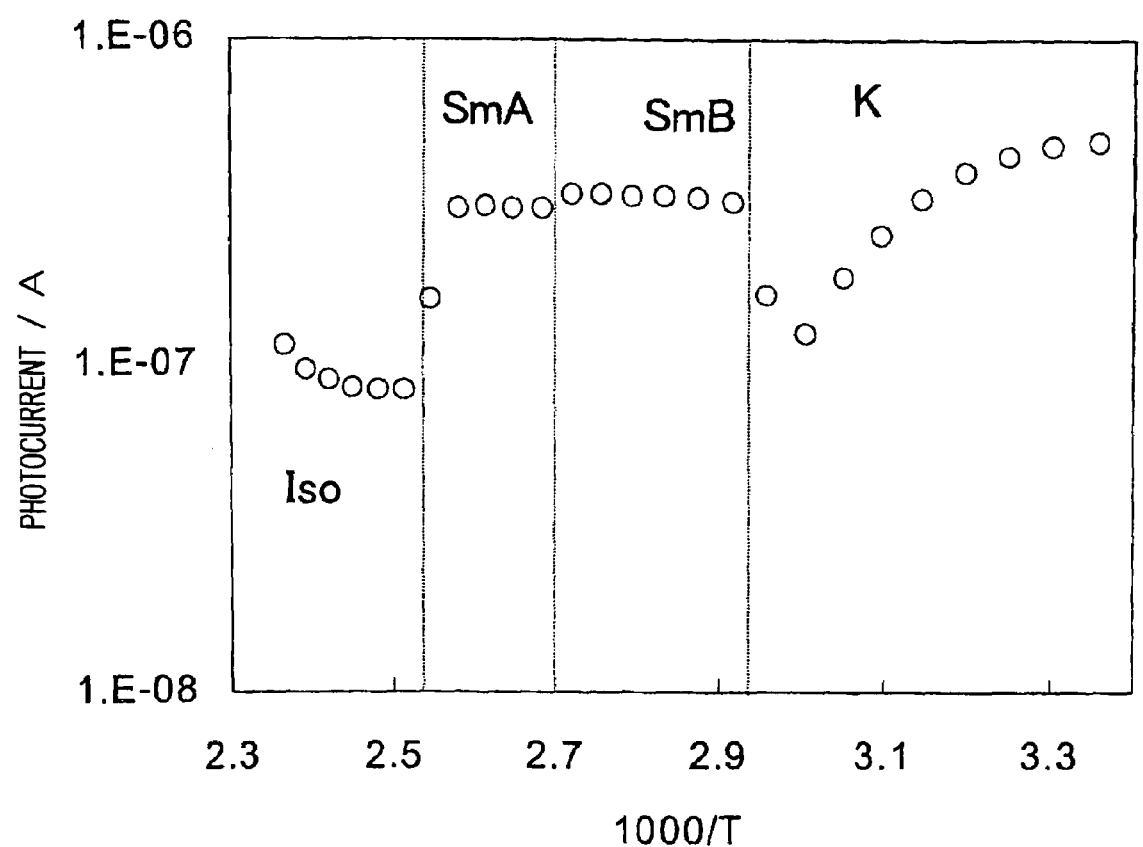
FIG. 2 is a diagram showing the results of measurement of photoconductivity of an organic semiconductor layer formed by providing an organic semiconductor material on a substrate subjected to alignment treatment.

1. Organic Semiconductor Structure and Process for Producing the Same

The organic semiconductor structure according to the present invention has, at least a part thereof, an organic semiconductor layer formed of an aligned liquid crystalline organic semiconductor material (hereinafter often referred to simply as "organic semiconductor material"). In the production process of an organic semiconductor structure according to the present invention, the liquid crystalline organic semiconductor material for constituting the organic semiconductor layer is held at a temperature suitable for the conversion of the liquid crystalline organic semiconductor material to a liquid crystal state and is then cooled to convert the liquid crystalline organic semiconductor material to a crystal state. The contents of each construction of the organic semiconductor structure and the production process of the organic semiconductor structure will be described in detail.

Organic Semiconductor Layer

The organic semiconductor layer comprises an aligned liquid crystalline organic semiconductor material. The organic semiconductor layer is formed on an aligning layer for placing molecular alignment in order in a liquid crystal phase, or on a substrate subjected to alignment treatment for that purpose, or in such a form that comes into contact with a layer with an electrode and having an aligning ability. The layer with an electrode and having an aligning ability may be a layer formed subsequent to the formation of the organic semiconductor layer.

Preferably, the organic semiconductor material comprises an organic compound having, in a part of the skeleton structure, L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings (also known as "core"), the skeleton structure having a terminal structure (also known as "terminal group") capable of developing liquid crystalline properties. The above structure can realize the formation of an organic semiconductor layer which is characterized by developing a high level of charge transfer characteristics derived from self-organization. Among materials having these molecular structures, those, which exhibit at least one liquid crystal state at a temperature below the heat decomposition temperature, are applied. In the π electron rings constituting the organic semiconductor material, L, M, N, O, P, Q, R, S, T, U, and V are each an integer of 0 (zero) to 6, and L+M+N+O+P+Q+R+S+T+U+V=1 to 6.

In the liquid crystalline organic semiconductor material, 6 π electron rings include, for example, benzene, furan, thiophene, pyrrole, 2H-pyran, 4H-thiopyran, pyridine, oxazole, isoxazole, thiazole, isothiazole, furazane, imidazole, pyrazole, pyrazine, pyrimidine, and pyridazine rings. 8 π electron rings include, for example, pentalene, indene, indolizine, and 4H-quinolizine rings. 10 π electron rings include, for example, naphthalene, azulene, benzofuran, isobenzofuran, 1-benzothiophene, 2-benzothiophene, indole, isoindole, 2H-chromene, 1H-2-benzopyran, quinoline, isoquinoline, 1,8-naphthyridine, benzimidazole, 1H-indazole, benzoxazole, benzothiazole, quinoxaline, quinazoline, cinnoline, pteridine, purine, and phthalazine rings. 12 π electron rings include, for example, heptalene, biphenylene, as-indacene, s-indacene, acenaphthylene, fluorene, and phenalene rings. 14 π electron rings include, for example, phenanthrene, anthracene, carbazole, xanthene, acridine, phenanthridine, perimidine, 1,10-phenanthroline, phenazine, phenarsazine, and tetrathiafulvalene rings. 16 π electron rings include, for example, fluoranthene, acephenanthrylene, aceanthrylene, pyrene, thianthrene, phenoxathiine, phenoxazine, and phenothiazine rings. 18 π electron rings include, for example, triphenylene, chrysene, naphthacene, and pleiadene rings. 20 π electron rings include, for example, perylene ring. 22 π electron rings include, for example, picene, pentaphene, and pentacene rings. 24 π electron rings include, for example, tetraphenylene and coronene rings. 26 π electron rings include, for example, hexaphene, hexacene, and rubicene rings.

Skeleton structures having these aromatic rings in a part thereof include, for example, structures represented by chemical formulae 1 to 34.

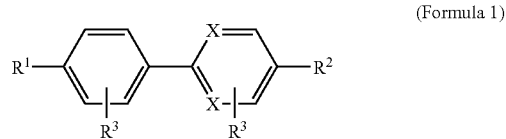

(Formula 1)

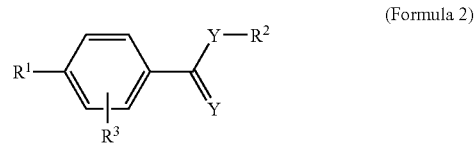

(Formula 2)

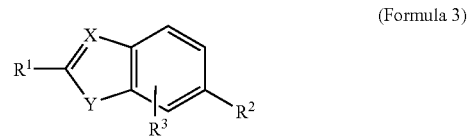

(Formula 3)

(Formula 4)
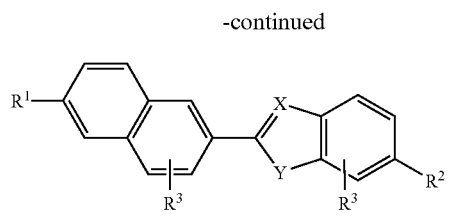
(Formula 5)
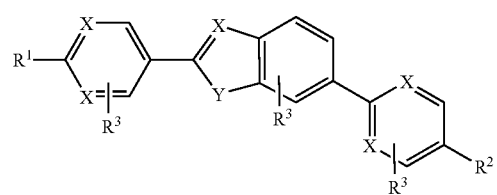
(Formula 6)
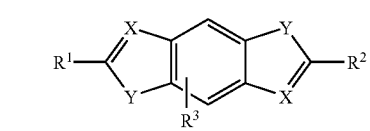
(Formula 7)
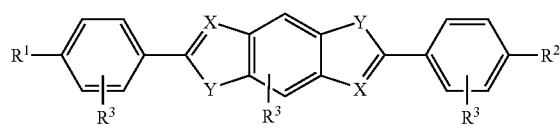
(Formula 8)
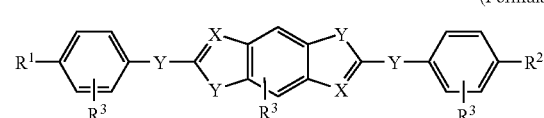
(Formula 9)
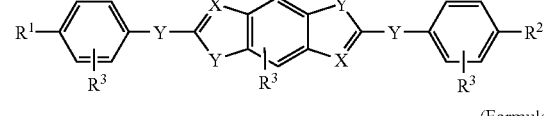
(Formula 10)
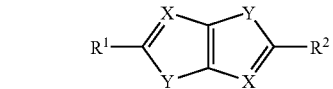
(Formula 11)
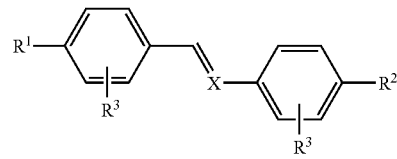
(Formula 12)
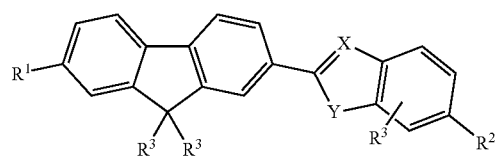
(Formula 13)
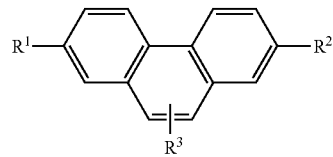
(Formula 14)
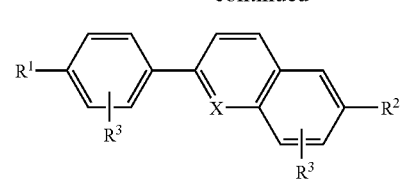
(Formula 15)
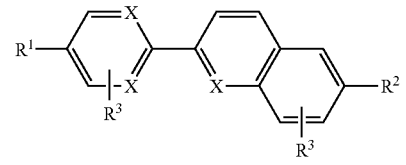
(Formula 16)
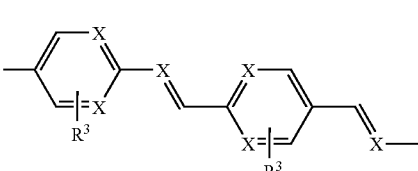
(Formula 17)
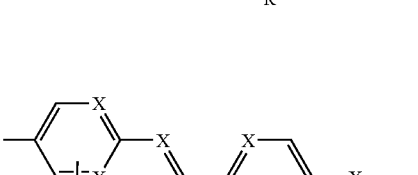
(Formula 18)
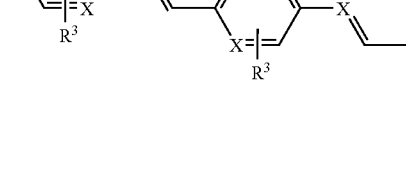
(Formula 19)
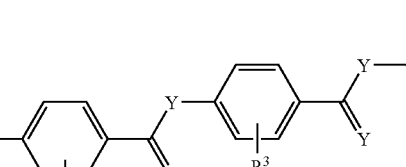
(Formula 20)
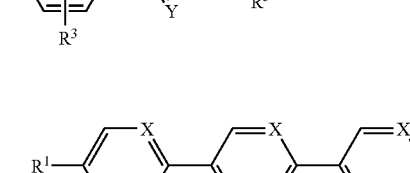
(Formula 21)
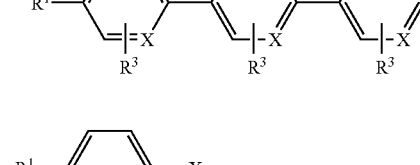

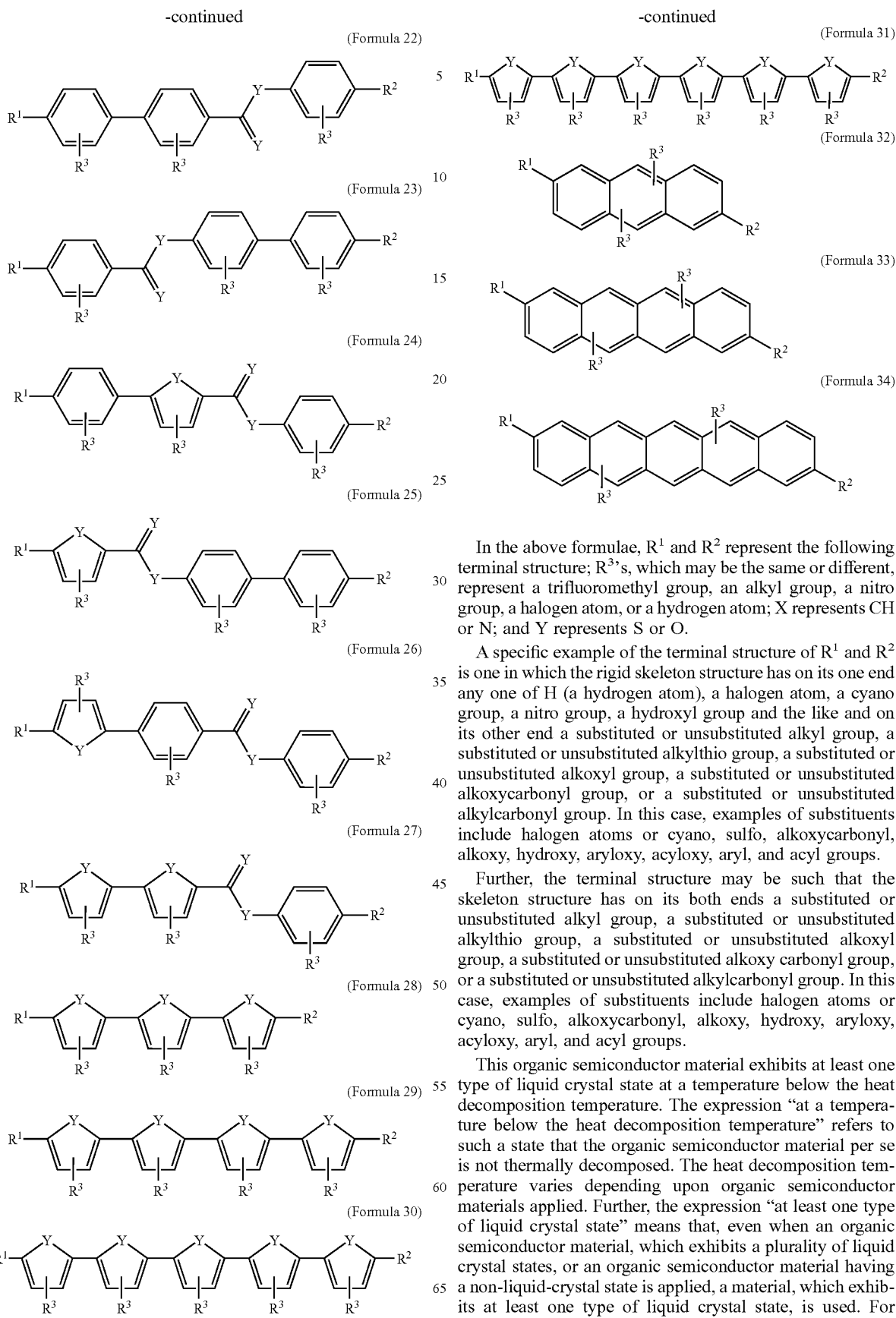

In the above formulae, $R^1$ and $R^2$ represent the following terminal structure; $R^3$'s, which may be the same or different, represent a trifluoromethyl group, an alkyl group, a nitro group, a halogen atom, or a hydrogen atom; X represents CH or N; and Y represents S or O.

A specific example of the terminal structure of $R^1$ and $R^2$ is one in which the rigid skeleton structure has on its one end any one of H (a hydrogen atom), a halogen atom, a cyano group, a nitro group, a hydroxyl group and the like and on its other end a substituted or unsubstituted alkyl group, a substituted or unsubstituted alkylthio group, a substituted or unsubstituted alkoxyl group, a substituted or unsubstituted alkoxycarbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

Further, the terminal structure may be such that the skeleton structure has on its both ends a substituted or unsubstituted alkyl group, a substituted or unsubstituted alkylthio group, a substituted or unsubstituted alkoxyl group, a substituted or unsubstituted alkoxy carbonyl group, or a substituted or unsubstituted alkylcarbonyl group. In this case, examples of substituents include halogen atoms or cyano, sulfo, alkoxycarbonyl, alkoxy, hydroxy, aryloxy, acyloxy, aryl, and acyl groups.

This organic semiconductor material exhibits at least one type of liquid crystal state at a temperature below the heat decomposition temperature. The expression "at a temperature below the heat decomposition temperature" refers to such a state that the organic semiconductor material per se is not thermally decomposed. The heat decomposition temperature varies depending upon organic semiconductor materials applied. Further, the expression "at least one type of liquid crystal state" means that, even when an organic semiconductor material, which exhibits a plurality of liquid crystal states, or an organic semiconductor material having a non-liquid-crystal state is applied, a material, which exhibits at least one type of liquid crystal state, is used. For example, a smectic (hereinafter referred to also as "Sm")

liquid crystal, which will be described later, exhibits a plurality of liquid crystal states of SmA phase, SmB phase, SmC phase, SmD phase . . . , and the material to be used should exhibit at least one of these liquid crystal states.

The organic semiconductor material adopted in the organic semiconductor structure according to the present invention is selected, from the above specific examples of organic semiconductor materials, by taking into consideration charge transfer characteristics and properties required of the organic semiconductor structure to be produced. A charge mobility of not less than $10^{-5}$ cm$^2$/V·s may be mentioned as a property value used as a basis of selection.

Among the above various organic semiconductor materials, materials having a smectic liquid crystal phase are preferred. Liquid crystal is a material having a self-organizing function. In particular, for the smectic liquid crystal, molecular alignment is spontaneously realized, and the liquid crystal is formed with a high orientation order as in crystals. An organic semiconductor layer formed of a material having smectic liquid crystallinity can exhibit excellent charge transfer properties as in molecular crystals. Further, when the degree of orientation order of the smectic liquid crystal constituting the organic semiconductor layer is higher, molecules are aligned more orderly and a higher level of orientation similar to that of crystals can be provided. Therefore, the intermolecular distance is very small. This leads to such a significant effect that excellent charge transfer characteristics derived from hopping conduction can be provided.

A specific example of a smectic liquid crystal is a liquid crystalline organic semiconductor material having a phenyl-naphthalene skeleton represented by chemical formula 35.

(Formula 35)

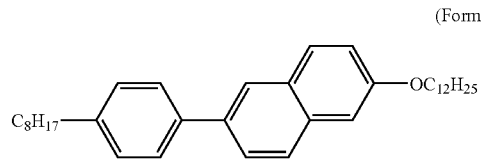

This compound is converted to a crystal state at a temperature of 54° C. or below. Therefore, this compound is held at 55 to 128° C., that is, a temperature capable of maintaining or experiencing a liquid crystal phase, and is then gradually cooled to 54° C. or below at a rate of 0.1 to 1.0° C./min. As a result, this compound can be brought to a crystal state while maintaining the well aligned state. The organic semiconductor layer thus formed has a charge mobility of $10^{-5}$ to $5\times10^{-2}$ cm$^2$/V·s, that is, excellent charge transfer characteristics.

Another example of a smectic liquid crystal is a liquid crystalline organic semiconductor material having a phenyl-naphthalene skeleton represented by chemical formula 36.

(Formula 36)

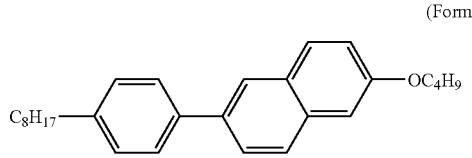

This compound is converted to a crystal state at a temperature of 79° C. or below. Therefore, this compound is heated to 80 to 121° C., that is, a temperature capable of maintaining or experiencing a liquid crystal phase, and is then gradually cooled to 79° C. or below at a rate of 0.1 to 1.0° C./min. As a result, this compound can be brought to a crystal state while maintaining the well aligned state. The organic semiconductor layer thus formed has a charge mobility of $10^{-5}$ to $5\times10^{-2}$ cm$^2$/V·s, that is, excellent charge transfer characteristics.

Still another example of a smectic liquid crystal is a liquid crystalline organic semiconductor material having a terthiophene skeleton represented by chemical formula 37.

(Formula 37)

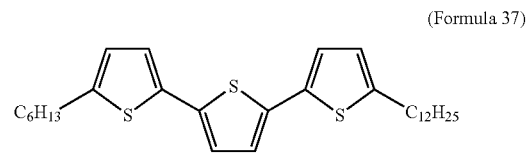

This compound is converted to a crystal state at a temperature of 56° C. or below. Therefore, this compound is heated to 57 to 88° C., that is, a temperature capable of maintaining or experiencing a liquid crystal phase (SmF phase), and is then gradually cooled to 56° C. or below at a rate of 0.1 to 1.0° C./min. As a result, this-compound can be brought to a crystal state while maintaining the well aligned state. The organic semiconductor layer thus formed has a charge mobility of $10^{-5}$ to $5\times10^{-2}$ cm$^2$/V·s, that is, excellent charge transfer characteristics.

A further example of a smectic liquid crystal is a liquid crystalline organic semiconductor material having a terthiophene skeleton represented by chemical formula 38.

(Formula 38)

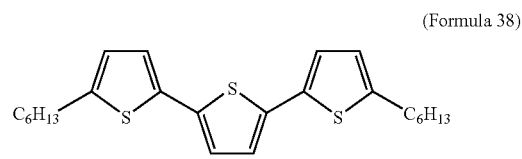

This compound is converted to a crystal state at a temperature of 54° C. or below. Therefore, this compound is heated to 55 to 84° C., that is, a temperature capable of maintaining or experiencing a liquid crystal phase (SmB phase), and is then gradually cooled to 54° C. or below at a rate of 0.1 to 1.0° C./min. As a result, this compound can be brought to a crystal state while maintaining the well aligned state. The organic semiconductor layer thus formed has a charge mobility of $10^{-6}$ to $5\times10^{-3}$ cm$^2$/V·s, that is, excellent charge transfer characteristics.

A still further example of a smectic liquid crystal is a liquid crystalline organic semiconductor material having a phenylbenzothiazole skeleton represented by chemical formula 39.

(Formula 39)

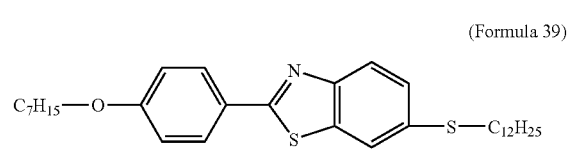

This compound is converted to a crystal state at a temperature of 90° C. or below. Therefore, this compound is heated to 91 to 100° C., that is, a temperature capable of maintaining or experiencing a liquid crystal phase (SmA phase), and is then gradually cooled to 90° C. or below at a rate of 0.1 to 1.0° C./min. As a result, this compound can be brought to a crystal state while maintaining the well aligned state. The organic semiconductor layer thus formed has a charge mobility of $10^{-6}$ to $5 \times 10^{-3}$ cm$^2$/V·s, that is, excellent charge transfer characteristics.

Further, materials suitable for the present invention may be selected from materials described in Japanese Patent Laid-Open No. 316442/1997 and U.S. Pat. No. 5,766,510.

The above liquid crystalline organic semiconductor materials are characterized in that any charge of electrons and holes can be transported, that is, "transfer of both polarities" is possible, and that the dependence of the charge mobility upon field strength and temperature is small in the case of an identical liquid crystal phase state.

In the organic semiconductor structure according to the present invention, depending upon the type of the liquid crystalline organic semiconductor material used in the formation of the organic semiconductor layer, the relationship between the temperature, at which the liquid crystalline organic semiconductor material is converted to a crystal phase, and the temperature, at which the liquid crystal phase can be maintained or experienced, is taken into consideration. Based on this consideration, an organic semiconductor material is formed at such a temperature that a liquid crystal phase is maintained or experienced. Thereafter, the organic semiconductor material is gradually cooled at a rate of 0.1 to 1.0° C./min to a temperature below the crystal phase formation temperature. In this case, the temperature at which the liquid crystalline organic semiconductor material can maintain or experience the liquid crystal phase varies depending upon the type of the liquid crystalline organic semiconductor material. In the present invention, however, any liquid crystalline organic semiconductor material, which exhibits at least one type of liquid crystal state at a temperature below the heat decomposition temperature thereof, can be used.

When the rate of gradual cooling is less than 0.1° C./min, disadvantageously, the time necessary for cooling is too long. On the other hand, when the rate of gradual cooling exceeds 1.0° C./min, structure defects with respect to charge transfer disadvantageously occur due to rapid contraction in volume of the crystal phase.

Methods for forming an organic semiconductor material on a layer forming face at such a temperature that a liquid crystal phase (a phase in a liquid crystal state) can be maintained or experienced include one wherein an organic semiconductor material is coated in a liquid crystal state on the layer forming face and the coating is then gradually cooled and converted to a crystal state, and one wherein an organic semiconductor material is vapor-deposited, e.g., by PVC or CVD, on the layer forming face, and the deposit is heated to a temperature at which a liquid crystal phase is exhibited to once experience the liquid crystal phase, followed by gradual cooling to covert the deposit to a crystal state. In particular, the above organic semiconductor material is fluid at such a temperature that the liquid crystal state is maintained. Therefore, the organic semiconductor material can be coated in this liquid crystal state to form a coating which is then gradually cooled to convert the coating to a crystal state. According to this method, a large-area organic semiconductor layer having uniform charge transfer characteristics can be very easily formed. Various coating and printing methods may be used for coating. The term "crystal phase" or "crystal state" as used herein means that the liquid crystalline organic semiconductor material is in the aggregate formed at a temperature below the liquid crystal-crystal phase transition temperature.

In the liquid crystalline organic semiconductor material in a crystal state, the liquid crystalline molecules are aligned in a given orientation or direction by aligning means which will be descried later. Therefore, the liquid crystalline molecules are regularly properly aligned as in molecular crystals, and the average intermolecular distance of the liquid crystalline molecules is as small as 0.3 to 0.4 nm. In the organic semiconductor layer in a crystal state with this intermolecular distance, electron correlation between molecules themselves is very strong. In this case, advantageously, hopping probability of carriers is high, and a high level of charge transfer characteristics can be realized. For example, in the liquid crystalline molecules having smectic liquid crystallinity represented by chemical formula 35, when the average intermolecular distance is 0.3 to 0.4 nm, a high level of charge transfer characteristics, that is, a charge mobility as high as $10^{-3}$ to $10^{-2}$ cm$^2$/V·s, can be realized.

Liquid Crystal Aligning Means

In the organic semiconductor structure according to the present invention, the organic semiconductor layer is provided in contact with a liquid crystal aligning layer. In this case, the organic semiconductor layer is formed of a liquid crystalline organic semiconductor material provided in contact with the liquid crystal aligning layer to anisotropically align the liquid crystalline organic semiconductor material in a specific direction. Specifically, an aligning layer as the liquid crystal aligning means is provided so as to come into contact with the organic semiconductor layer, whereby the liquid crystalline organic semiconductor material is anisotropically aligned by the aligning layer. In the alignment of the liquid crystalline organic semiconductor material using the liquid crystal aligning means, even when the material is converted by cooling from a liquid crystal state to a crystal phase, crystallization can be carried out while maintaining the molecular alignment. Each crystal domain in crystals formed in this way is so large that the charge mobility is advantageously increased.

Examples of the aligning means include the formation of a liquid crystal aligning layer on a liquid crystalline organic semiconductor material forming face (a layer forming face, for example, a surface of a gate insulating layer which will be described later), aligning treatment such as rubbing treatment, and contact with a layer subjected to alignment treatment. These aligning means can align liquid crystalline molecules of the liquid crystalline organic semiconductor material in a specific orientation or direction. Therefore, functionalities and electric characteristics characteristic of the orientation or direction of the alignment can be developed.

The relationship between the aligning means and the liquid crystalline organic semiconductor material is preferably such that the liquid crystalline organic semiconductor material is stacked and aligned on a liquid crystal aligning layer formed of a polyimide material, that the liquid crystalline organic semiconductor material is stacked and aligned on a liquid crystal aligning layer formed of a cured resin having fine concaves and convexes on its surface, or that the liquid crystalline organic semiconductor material is provided on a substrate formed of a cured resin having fine concaves and convexes on its surface.

Various liquid crystal aligning layers can be applied for liquid crystal alignment purposes. In the organic semiconductor structure according to the present invention, however, the liquid crystal aligning layer is preferably any one of a layer formed by coating a polyimide material and then subjecting the coating to rubbing treatment, a layer formed of a cured resin having fine concaves and convexes, and a layer which is formed of a cured resin having fine concaves and convexes and functions also as a substrate. The alignment of liquid crystalline molecules by external field such as electric field or magnetic field is also possible.

A typical liquid crystal aligning layer is a layer formed by coating a polyimide resin and then subjecting the coating to rubbing treatment. In addition to the polyimide resin, other materials usable herein include resin materials such as acrylic, polychloropyrene, polyethylene terephthalate, polyoxymethylene, polyvinyl chloride, poly(vinylidene fluoride), cyanoethyl pullulan, polymethyl methacrylate, polysulfone, polycarbonate, and polyimide resins. These materials can be classified into types which can perpendicularly align the liquid crystal and types which can horizontally align the liquid crystal. Specific examples of coating methods include spin coating, casting, and pull-up methods. The liquid crystal aligning layer may be provided between the substrate and the organic semiconductor layer or on an overcoat overlying the organic semiconductor layer.

The liquid crystal aligning layer formed of a cured resin having fine concaves and convexes may be formed, for example, by forming a layer of a curable resin, either subjecting the surface of the layer to rubbing treatment to form concaves and convexes, or pressing a shaping member capable of forming fine concaves and convexes against the surface of the uncured curable resin layer, and then curing the resin layer. The surface of the cured resin has fine concaves and convexes in predetermined orientation which can align liquid crystalline molecules of the liquid crystalline organic semiconductor material in this orientation. Curable resins include ultraviolet-curable acrylic resins and ultraviolet-curable fluorocarbon resins. At that time, particularly preferably, the liquid crystal aligning layer formed of a cured resin having fine concaves and convexes is integral with a substrate.

The fine concaves and convexes comprise fine grooves provided in an identical direction. In the grooves in the concave-convex part, the depth is approximately 0.01 to 1.0 µm, preferably 0.03 to 0.3 µm, the width is approximately 0.05 to 1.0 µm, and the pitch of adjacent grooves is approximately 0.1 to 2.0 µm. When the depth of the grooves is less than 0.01 µm, the liquid crystal molecules cannot be properly aligned. On the other hand, when the depth of the grooves exceeds 1.0 µm, the alignment of the liquid crystal is sometimes disordered at the edge of the grooves. When the width of the grooves is less than 0.05 µm, the preparation of the grooves is difficult. On the other hand, when the width of the grooves exceeds 1.0 µm, the alignment force at the center of the groove is sometimes lowered. When the pitch of the grooves is less than 0.1 µm, the preparation of the grooves is difficult. On the other hand, when the pitch of the grooves exceeds 2.0 µm, the disorder of the alignment of the liquid crystal is likely to occur.

In the organic semiconductor structure according to the present invention, a first embodiment of the liquid crystal aligning layer comprises a substrate, a liquid crystal aligning layer, and an organic semiconductor layer successively stacked in that order. A second embodiment of the liquid crystal aligning layer comprises a substrate, an organic semiconductor layer, and a liquid crystal aligning layer successively stacked in that order. A third embodiment of the liquid crystal aligning layer comprises a substrate, a liquid crystal aligning layer, an organic semiconductor layer, and a liquid crystal aligning layer successively stacked in that order. Thus, in the present invention, when the organic semiconductor layer is constructed in contact with a layer subjected to alignment treatment, a high level of alignment of the liquid crystalline molecules constituting the liquid crystalline organic semiconductor material can be realized.

Organic Semiconductor Structure

The organic semiconductor structure having the above construction will be described in more detail with reference to FIGS. 1 and 2.

FIG. 1 is a diagram showing the results of measurement of photoconductivity of an organic semiconductor layer formed by providing an organic semiconductor material having a phenylnaphthalene skeleton on a substrate not subjected to alignment treatment. FIG. 1(A) shows the results of measurement of photoconductivity for a liquid crystal phase (90° C., SmB phase), and FIG. 1(B) shows the results of measurement of photoconductivity for a crystal phase (65° C.). When no alignment treatment is carried out, substantially no photoconductivity is provided due to the influence of grain boundaries (structure defects) in the crystal phase.

FIG. 2 is a diagram showing the results of measurement of photoconductivity of an organic semiconductor layer formed by providing an organic semiconductor material having a phenylnaphthalene skeleton on a substrate, bringing the organic semiconductor material to a liquid crystal state, then gradually cooling the organic semiconductor material to perform alignment treatment. For the material subjected to alignment treatment, even in a crystal state, a high level of photoconductivity could be provided. Further, in this case, the photocurrent is larger than that of the smectic layer. In FIG. 2, ISO represents an isotropic phase, SmA a smectic A phase, SmB a smectic B phase, and K a crystal phase.

The reason why this phenomenon takes place is believed to be as follows. Specifically, it is known that the charge transfer characteristics of a rodlike liquid crystalline organic semiconductor material is not influenced by the grain structure of the smectic liquid crystal state. Crystallization without alignment treatment probably causes the grain structure to be changed to a fine crystal state. This change results in the occurrence of detects among crystals which inhibits charge transfer. On the other hand, for example, in the case of an organic semiconductor layer in a smectic liquid crystal state in contact with an aligning treatment layer (same as the liquid crystal aligning layer), in addition to an adjacent field, a structural order over a long distance attributable to the aligning treatment layer exists. During the conversion of the liquid crystal state to the crystal state, the long-distance order is maintained. Therefore, it is considered that the aggregates of fine polycrystals are not formed. By virtue of this, even in the crystal state, a high level of mobility is provided, and, in some temperature region, the mobility is higher than that in the smectic liquid crystal state.

The crystal phase of the liquid crystalline rodlike organic semiconductor material has a high level of charge mobility, and an organic semiconductor structure utilizing this property has high performance. Organic semiconductor devices comprising this organic semiconductor structure, for example, transistors, organic ELs, solar cells, and sensors, have unprecedentedly high performance. In particular, when this organic semiconductor structure is utilized in an organic EL element, a high level of polarized light emission derived from the molecular alignment can be realized.

Liquid crystalline rodlike organic semiconductor materials per se exhibit electroluminescence. However, the introduction of a side chain into an organic material, which can function as a luminescence center, followed by the addition of the treated organic material to a liquid crystalline organic semiconductor as a base material can control the positional relationship between a charge transfer path for the organic semiconductor and the organic material as the luminescence center. This can contribute to improved emission efficiency.

Examples of contemplated constructions of organic ELs using the above organic semiconductor material are as follows:

(i) substrate/electrode/liquid crystal aligning layer/liquid crystalline organic semiconductor layer/electrode, (ii) substrate/electrode/liquid crystalline organic semiconductor layer/liquid crystal aligning layer/electrode/substrate, (iii) substrate/liquid crystal aligning layer/electrode/liquid crystalline organic semiconductor layer/electrode, (iv) substrate/electrode/liquid crystal aligning layer/liquid crystalline organic semiconductor layer/liquid crystal aligning layer/electrode/substrate, and (v) substrate/electrode/liquid crystal aligning layer/electrode/liquid crystal aligning layer/substrate.

2. Organic Semiconductor Device

Figure 3:
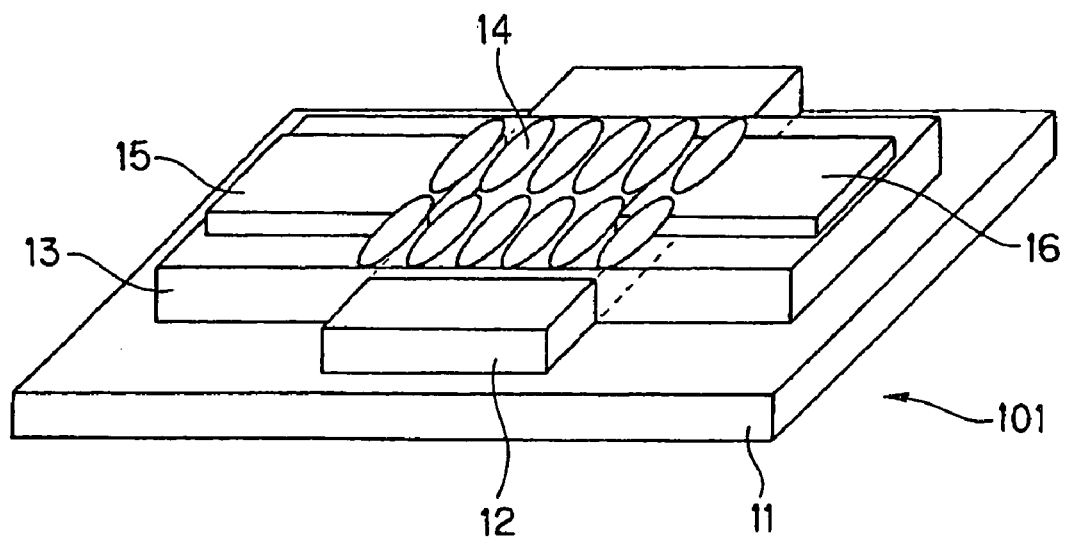
FIG. 3 is a cross-sectional view showing an embodiment of the organic semiconductor device according to the present invention.
Figure 4:
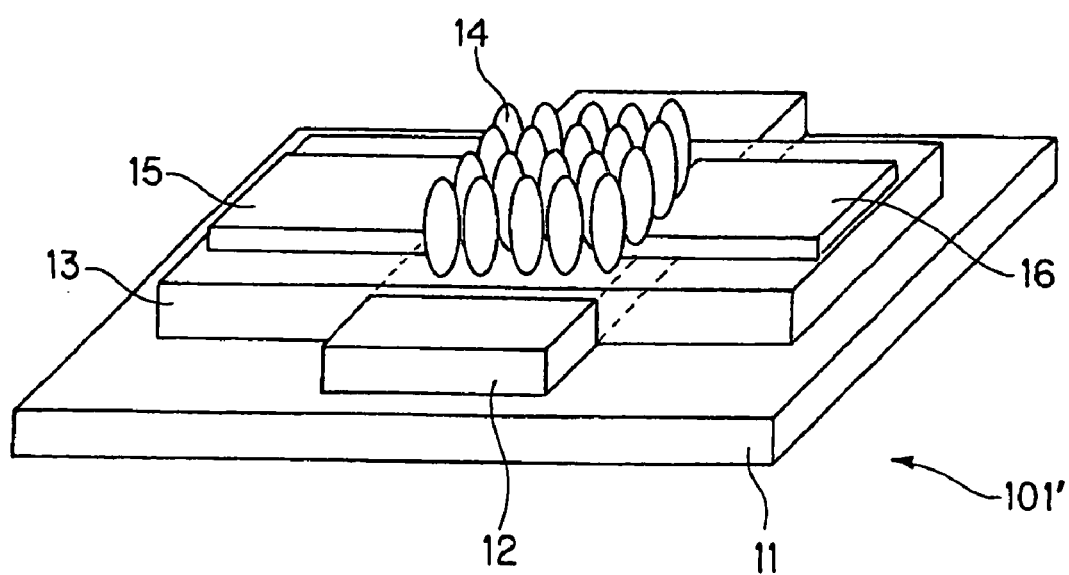
FIG. 4 is a cross-sectional view showing another embodiment of the organic semiconductor device according to the present invention.

As shown in FIGS. 3 and 4, an organic semiconductor device 101 according to the present invention includes at least a substrate 11, a gate electrode 12, a gate insulating layer 13, an organic semiconductor layer 14 comprising an aligned liquid crystalline organic semiconductor material, a drain electrode 15, and a source electrode 16. In this organic semiconductor device 101, the organic semiconductor layer 14 is formed of an organic semiconductor material constituting the organic semiconductor structure according to the present invention.

Examples of constructions include an inversely staggered structure comprising the substrate 11 and, provided on the substrate 11 in the following order, the gate electrode 12, the gate insulating layer 13, the organic semiconductor layer 14 formed of an aligned liquid crystalline organic semiconductor material, the drain electrode 15 and the source electrode 16, and a protective film (not shown), and a coplanar structure comprising the substrate 11 and, provided on the substrate 11 in the following order, the gate electrode 12, the gate insulating layer 13, the drain electrode 15 and the source electrode 16, the organic semiconductor layer 14 formed of an aligned liquid crystalline organic semiconductor material, and a protective film (not shown). The organic semiconductor device 101 having the above construction is operated in a storage or deficiency state according to the polarity of voltage applied to the gate electrode 12. The members constituting the organic semiconductor device will be described in detail.

Substrate

The substrate 11 may be selected from a wide range of insulating materials. Examples of such materials include various insulating materials, for example, inorganic materials such as glasses and alumina sinters, and polyimide films, polyester films, polyethylene films, polyphenylene sulfide films, and polyparaxylene films. In particular, the use of films of polymeric compounds is very useful because lightweight and flexible organic semiconductor devices can be prepared. The thickness of the substrate 11 applied in the present invention is about 25 µm to 1.5 mm.

Gate Electrode

The gate electrode 12 is preferably an electrode formed of an organic material such as polyaniline or polythiophene, or an electrode formed by coating an electrically conductive ink. Since these electrodes can be formed by coating an organic material or an electrically conductive ink, the electrode formation process is advantageously very simple. Specific examples of coating methods include spin coating, casting, and pull-up methods.

When a metallic film is formed as an electrode, a conventional vacuum film formation method can be used. Specifically, a mask film formation method or a photolithographic method may be used. In this case, materials for electrode formation usable herein include inorganic materials, for example, metals such as gold, platinum, chromium, palladium, aluminum, indium, molybdenum, and nickel, alloys using these metals, polysilicon, amorphous silicon, tin oxide, indium oxide, and indium tin oxide (ITO). Two or more of these materials may be used in combination.

The film thickness of the gate electrode is preferably about 50 to 1000 nm, although the film thickness varies depending upon the electrical conductivity of the material. The lower limit of the thickness of the gate electrode varies depending upon the electrical conductivity of the electrode material and the strength of adhesion between the gate electrode and the underlying substrate. The upper limit of the thickness of the gate electrode should be such that, when a gate insulating layer and a source-drain electrode pair which will be described later is provided, the insulation covering by the gate insulating layer in a level difference part between the underlying substrate and the gate electrode is satisfactory and an overlying electrode pattern is not broken. In particular, when a flexible substrate is used, a stress balance should be taken into consideration.

Gate Insulating Layer

As with the gate electrode 12, the gate insulating layer 13 is preferably formed by coating an organic material. Organic materials usable herein include polychloropyrene, polyethylene terephthalate, polyoxymethylene, polyvinyl chloride, poly(vinylidene fluoride), cyanoethyl pullulan, polymethyl methacrylate, polysulfone, polycarbonate, and polyimide. Specific examples of coating methods include spin coating, casting, and pull-up methods.

Alternatively, the gate insulating layer may be formed by a conventional pattern process such as CVD. In this case, inorganic materials such as $SiO_2$, $SiNx$, and $Al_2O_3$ are preferably used. Two or more of these materials may be used in combination.

Since the mobility of the organic semiconductor device depends upon field strength, the thickness of the gate insulating layer is preferably about 50 to 300 nm. In this case, the withstand voltage is preferably not less than 2 MV/cm.

Drain Electrode and Source Electrode

The drain electrode 15 and the source electrode 16 are preferably formed of a metal having a large work function. The reason for this is as follows. Specifically, in the liquid crystalline organic semiconductor material which will be described later, carriers for transporting charges are holes, and, hence, the liquid crystalline organic semiconductor material should be in ohmic contact with the organic semiconductor layer 14. The term "work function" as used herein refers to a potential difference necessary for taking electrons out of the solid to the outside of the solid, and the work function is defined as a value obtained by dividing a difference in energy, between vacuum level and Fermi level, by the quantity of electric charge. The work function is preferably about 4.6 to 5.2 eV, and specific examples of such metals include gold, platinum, and transparent electrically conductive films (for example, indium tin oxide and indium zinc oxide). The transparent electrically conductive film may be formed by sputtering or electron beam (EB) evaporation.

The thickness of the drain electrode 15 and the source electrode 16 applied in the present invention is about 50 to 100 nm.

Organic Semiconductor Layer

The organic semiconductor layer 14 is formed of an aligned liquid crystalline organic semiconductor material and may be formed, for example, by subjecting the liquid crystalline organic semiconductor material to the above alignment treatment and then converting the aligned liquid crystalline organic semiconductor material to a crystal state. Specific examples of organic semiconductor materials are as described above.

Further, the alignment treatment of the organic semiconductor material, the liquid crystal aligning layer, etc. are also as described above. Specifically, in the present invention, since the liquid crystalline organic semiconductor material is used, upon the above alignment treatment, liquid crystalline molecules are aligned in a given orientation or direction. As compared with conventional organic semiconductor layers, the organic semiconductor layer 14, which has been subjected to alignment treatment and converted to a crystal phase, has excellent effects, that is, is free from cracking or the like and does not cause any harmful effects such as lowered charge transport speed based on the cracking.

Embodiments of the alignment of liquid crystalline molecules include (i) an embodiment as shown in FIG. 3 in which the liquid crystalline molecules are aligned in a direction orthogonal to the film thickness direction of the drain electrode 15 and the source electrode 16 provided on the gate insulating layer 13 and so as to be transversely arranged between the drain electrode 15 and the source electrode 16, and (ii) an embodiment as shown in FIG. 4 in which the liquid crystalline molecules are aligned in parallel with the film thickness direction of the drain electrode 15 and the source electrode 16 provided on the gate insulating layer 13.

In the organic semiconductor layer 14 in the embodiments shown in FIGS. 3 and 4, as described above, adjacent rodlike liquid crystalline molecules are aligned in an intermolecular distance of about 0.3 to 0.4 nm. Therefore, for example, in the case of SmA phase in a smectic liquid crystal system, large anisotropy of charge transport characteristics appears between the Sm layer in its in-plane direction having a smaller intermolecular distance and the Sm layer in its inter-plane direction, perpendicular-to the Sm layer, having a large intermolecular distance of not less than 3 nm. The anisotropy of the charge transport characteristics is based on the fact that molecular alignment is spontaneously realized by the self-organization of the liquid crystalline organic semiconductor material and the liquid crystal is formed with a high orientation order as in crystals.

The organic semiconductor layer thus formed has such a unique effect that a defect-free, uniform, large-size organic semiconductor layer can be formed. The electron transport speed of the organic semiconductor layer 14 is not less than $10^{-2}$ cm$^2$/V·s, and, more preferably, the hole transport speed is not less than $10^{-2}$ cm$^2$/V·s. In order to provide such property values, the liquid crystalline organic semiconductor material, the alignment treatment, etc. may be examined at any time before the formation of the organic semiconductor layer. This charge transport speed of the organic semiconductor layer 14 can advantageously contribute, for example, to a lowering in drive voltage of organic thin-film transistors or to an improvement in response speed.

When the layer forming face, on which the liquid crystalline organic semiconductor material is formed, is a gate insulating layer or a substrate, the gate insulating layer or the substrate may be subjected to rubbing treatment so that the gate insulating layer or the substrate serves also as the alignment treatment film.

The thickness of the alignment control layer is preferably in such a thickness range that does not hinder ohmic contact of the drain electrode 15 and the source electrode 16 with the organic semiconductor layer 14, that is, in the range of 0.5 to 10 nm.

Interlayer Insulating Layer

An interlayer insulating layer is preferably provided in the organic semiconductor device 101. The interlayer insulating layer is provided from the viewpoint of preventing contamination of the surface of the gate electrode 12 in forming the drain electrode 15 and the source electrode 16 on the gate insulating layer 13. Therefore, the interlayer insulating layer is formed on the gate insulating layer 13 before the formation of the drain electrode 15 and the source electrode 16. After the formation of the source electrode 15 and the drain electrode 16, the interlayer insulating layer in its part located above the channel region is entirely or partly removed. Preferably, the interlayer insulating layer in its region to be removed has a size equal to the size of the gate electrode 12.

Materials usable for constituting the interlayer insulating layer include inorganic materials such as SiO, SiNx, Al$_2$O$_3$ and organic materials such as polychloropyrene, polyethylene terephthalate, polyoxymethylene, polyvinyl chloride, poly(vinylidene fluoride), cyanoethyl pullulan, polymethyl methacrylate, polysulfone, polycarbonate, and polyimide.

Organic Semiconductor Device

Constructions adoptable in the organic semiconductor device according to the present invention include (i) substrate/gate electrode/gate insulating layer (which serves also as liquid crystal aligning layer)/source-drain electrode/liquid crystalline organic semiconductor layer/(protective layer), (ii) substrate/gate electrode/gate insulating layer/source-drain electrode/liquid crystal aligning layer/liquid crystalline organic semiconductor layer/(protective layer), (iii) substrate/gate electrode/gate insulating layer (which serves also as liquid crystal aligning layer)/liquid crystalline organic semiconductor layer/source-drain electrode/(protective layer), (iv) substrate/gate electrode/gate insulating layer (which serves also as liquid crystal aligning layer)/liquid crystalline organic semiconductor layer/substrate with source-drain electrode patterned thereon (which serves also as protective layer), (v) substrate/source-drain electrode/liquid crystalline organic semiconductor layer/gate insulating layer (which serves also as liquid crystal aligning layer)/gate electrode/substrate (which serves also as protective layer), and (vi) substrate (which serves also as aligning layer)/source-drain electrode/liquid crystalline organic semiconductor layer/gate insulating layer/gate electrode/substrate (which serves also as protective layer).

In the above organic semiconductor device, after the formation of a cell structure, pouring of a liquid crystal into the cell by utilizing capillarity followed by gradual cooling to crystallize the liquid crystalline organic semiconductor material is a simple production process. Alternatively, however, the organic semiconductor material may be vapor-deposited or coated.

EXAMPLES

The following Examples further illustrate the present invention.

An organic semiconductor device having a construction of substrate/gate electrode/gate insulating layer (serving also as liquid crystal aligning layer)/source-drain electrode/liquid crystalline organic semiconductor layer (/protective layer) was formed. In this Example, a layer of a liquid crystalline organic semiconductor material was formed on a glass substrate. The layer was then heated to a liquid crystal phase, thereby bringing the layer to a liquid crystal state. The layer was then gradually cooled to a crystal phase.

Substrate

A glass substrate (thickness 1.1 mm, Corning 1737), which had been ultrasonically cleaned with a neutral detergent, pure water, acetone, and IPA in that order, was used as a substrate.

Gate Electrode

A strip pattern (electrode width 100 μm, electrode spacing 5 mm) of gold (Au) (thickness 300 nm) was formed on the substrate through a metallic mask by resistance heating type vapor deposition. Thus, a gate electrode was formed. The same electrode pattern can be formed by patterning an ITO electrode by a wet process.

Gate Insulating Layer and its Alignment Treatment (a) Where molecules constituting the liquid crystalline organic semiconductor material were aligned horizontally to the substrate (see FIG. 3):

A gate insulating layer was formed as follows. A photosensitive polyimide (a dilution of 10 g of UR-3140 (Toray Industries, Inc.) with 25 g of n-methylpyrrolidone) was spin-coated. The coating was dried at 100° C. The dried coating was exposed and developed to expose a gate electrode terminal. Thereafter, the layer was fired at a maximum temperature of 350° C. to form a 300 nm-thick gate insulating layer.

The surface of the polyimide film thus formed was subjected to alignment treatment by rubbing with rubbing cloth, which was a polyester wound around a 48-mm roller, under conditions of 1200 rpm and substrate moving speed 600 mm/min. The rubbing was carried out in both a direction parallel to a channel-length direction (a charge transport direction) and a direction perpendicular to the channel-length direction.

In this Example, upon the alignment treatment, the liquid crystalline organic semiconductor material used in this Example is horizontally aligned. Therefore, the effect of the anisotropy of charge transfer (difference in charge transfer characteristics between major axis direction and minor axis direction of molecules) derived from the direction of the liquid crystal alignment on the characteristics of TFT was compared.

(b) Where molecules constituting the liquid crystalline organic semiconductor material were aligned perpendicularly to the substrate (see FIG. 4):

A 100 nm-thick $SiO_2$ film was formed on the substrate with the gate electrode provided thereon by RF sputtering (output 100 W×30 min). The liquid crystalline organic semiconductor material used in this Example is aligned perpendicularly on this substrate. Therefore, when TFT is constructed, charges are dominantly transported in a direction perpendicular to the major axis of molecules. In this case, the charge transfer is the same as that in the above case where rubbing has been carried out in a direction which is a horizontal alignment direction and perpendicular to the channel-length direction. In this Example, the effect of a liquid crystal side chain structure on charge injection and the effect of the liquid crystal side chain structure on the characteristics of TFT were investigated.

Source-Drain Electrode

Gold was deposited by resistance heating type vapor deposition through a metallic mask to form a source-drain electrode pad (channel length 50 μm, channel width 4 mm) (electrode thickness 100 nm). Aluminum (Al) was used as an electrode wire which was led out from the source-drain electrode pad.

Liquid Crystalline Organic Semiconductor Layer

A liquid crystalline organic semiconductor material using 6-TTP-12 represented by chemical formula 37 was deposited by resistance heating type vapor deposition through a metallic mask so that a rectangular pattern of 4 mm×100 μm was formed in a channel form between the above-formed source and drain to form a 50 nm-thick organic semiconductor layer which was then heated to 60° C. for transition to a liquid crystal phase. Thereafter, the layer was cooled at a rate of 0.1° C./min to form a functional film having a crystal phase which maintains a good aligned state by virtue of the aligned state of the liquid crystal phase.

Evaluation of Characteristics (a) Where molecules constituting liquid crystalline organic semiconductor material were aligned horizontally to substrate (see FIG. 3), that is, in the case of an organic semiconductor element wherein a 300 nm-thick polyimide layer was used as a gate insulating layer, a source electrode and a drain electrode were formed with a channel length of 50 μm and a channel width of 4 mm and 6-TTP-12 (compound 37) was used as an organic semiconductor layer:

For this type of an organic semiconductor element, an element in a fine polycrystalline state just after the preparation (Comparative Example 1) and an element prepared by heating the material in the fine polycrystalline state to 60° C. for phase transition to a liquid crystal phase and then gradually cooling the material at a rate of 0.1° C./min to form a crystal phase (Example 1) were provided. For each of the elements, a source-to-drain voltage Vds: 0 to −30 V and a gate voltage Vg: 0 to −30 V were applied, and the behavior of a change in source-to-drain current Ids upon the application of gate voltage Vg was determined and evaluated.

The element of Comparative Example 1 was not prepared through a liquid crystal phase. In this element, in the above measurement voltage range, there was no significant change in drain current depending upon the gate voltage.

On the other hand, the element of Example 1 is an element having a crystal phase formed through a liquid crystal phase. In this element, in the above measurement range, under given Vds conditions, the drain current increased with increasing the absolute value of the gate voltage. Under constant gate voltage conditions, the drain current increased with increasing the absolute value of the source-to-drain applied voltage, and further increasing the absolute value of the source-to-drain applied voltage resulted in such a phenomenon that the drain current in the so-called "organic transistor" reached a saturation region.

This tendency was particularly significant for the element in which the surface of the gate insulating layer before the formation of the source electrode and the drain electrode was rubbed in "a channel-width direction" (a direction perpendicular to the channel-length direction). In this case, the charge mobility of the organic semiconductor layer was $2\times10^{-3}$ cm$^2$/V·s based on Vg and Vds in the saturation region of the drain current and the structure of the element of Example 1.

The charge mobility of the organic semiconductor material (6-TTP-12 represented by chemical formula 37) was measured by TOF for a counter electrode-substrate pair (sandwich type) sample construction. As a result, the charge mobility corresponding to the phase series was as follows: crystal phase (immeasurable)/56° C./SmF phase ($5\times10^{-3}$ cm$^2$/V·s)/88° C./isotropic phase (approximately $10^{-5}$ cm$^2$/V·s).

As is apparent from the above results, for the element of Comparative Example 1 corresponding to the conventional method, despite the crystal phase, a high-speed charge transfer phenomenon and good transistor characteristics were not provided. On the other hand, the element of the example of the present invention had good charge mobility and could be realized in a very simpler manner than the conventional organic transistor having high mobility.

On the other hand, for the element in which the surface of the gate insulating layer before the formation of the source electrode and the drain electrode was rubbed in "a channel-length direction" (a direction parallel to the channel-length direction), the charge mobility of the organic semiconductor layer was not more than $5\times10^{-5}$ cm$^2$/V·s based on Vg and Vds in the saturation region of the drain current, and the structure of the element of Example 1. This value was smaller than that in the element which had been rubbed in the above "channel-width direction." The reason for this is believed to be as follows. The hopping site involved in the charge transfer of the liquid crystalline organic semiconductor material used is overlap of a conjugated system in a skeleton structure within the molecule of the material, whereas the alkyl chain as a terminal group used in this example serves as an insulating layer between molecular arrangements in the skeleton structure as a conductive path. By virtue of this, it is considered that the anisotropy of conductive characteristics has been realized by an identical material according to the molecular arrangement direction of the organic semiconductor.

(b) Where molecules constituting liquid crystalline organic semiconductor material were aligned perpendicularly to substrate (see FIG. 4), that is, in the case of an organic semiconductor element wherein 100 nm-thick SiO$_2$ was used as a gate insulating layer, a source electrode and a drain electrode were formed with a channel length of 50 μm and a channel width of 4 mm and 6-TTP-12 (compound 37) was used as an organic semiconductor layer:

For this type of an organic semiconductor element, an element in a fine polycrystalline state just after the preparation (Comparative Example 2) and an element prepared by heating the material in the fine polycrystalline state to 60° C. for phase transition to a liquid crystal phase and then gradually cooling the material at a rate of 0.1° C./min to form a crystal phase (Example 2) were provided. For each of the elements, a source-to-drain voltage Vds: 0 to –30 V and a gate voltage Vg: 0 to –30 V were applied, and the behavior of a change in source-to-drain current Ids upon the application of gate voltage Vg was determined and evaluated.

Also in (b), as with the above-described (a), for the element of Comparative Example 2 which had not been prepared through a liquid crystal phase, in the above measurement voltage range, there was no significant change in drain current depending upon the gate voltage.

On the other hand, for the element of Example 2 which is an element having a crystal phase formed through a liquid crystal phase, as with the above (a), transistor characteristics were developed, and the charge mobility of the organic semiconductor layer was 2 to $4\times10^{-4}$ cm$^2$/V·s, demonstrating that, according to the present invention, an organic transistor can be easily realized.

The invention claimed is:

1. An organic semiconductor structure having, in at least a part thereof, an organic semiconductor layer comprising an aligned liquid crystalline organic semiconductor material,
    said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material exhibiting at least one liquid crystal state at a temperature below the heat decomposition temperature thereof.

2. An organic semiconductor structure having, in at least a part thereof, an organic semiconductor layer comprising an aligned liquid crystalline organic semiconductor material,
    said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material exhibiting at least a smectic liquid crystal phase state at a temperature below the heat decomposition temperature thereof.

3. An organic semiconductor structure having, in at least a part thereof, an organic semiconductor layer comprising an aligned liquid crystalline organic semiconductor material,
    said liquid crystalline organic semiconductor material comprising an organic compound having a core comprising L 6 π electron rings, M 8 π electron rings, N 10 π electron rings, O 12 π electron rings, P 14 π electron rings, Q 16 π electron rings, R 18 π electron rings, S 20 π electron rings, T 22 π electron rings, U 24 π electron rings, and V 26 π electron rings, wherein L, M, N, O, P, Q, R, S, T, U, and V are each an integer of 0 (zero) to 6 and L+M+N+O+P+Q+R+S+T+U+V=1 to 6, said liquid crystalline organic semiconductor material having, at its both ends, a terminal group capable of developing liquid crystallinity.

4. The organic semiconductor structure according to any one of claims 1 to 3, wherein at least a part of said liquid crystalline organic semiconductor material in the organic semiconductor layer has been aligned and crystallized by holding the liquid crystalline organic semiconductor material at a temperature suitable for the conversion of the liquid crystalline organic semiconductor material to a liquid crystal state, and then cooling the liquid crystalline organic semiconductor material.

5. The organic semiconductor structure according to any one of claims 1 to 4, wherein said organic semiconductor layer is provided in contact with a liquid crystal aligning layer and the provision of the organic semiconductor layer in contact with the liquid crystal aligning layer allows the liquid crystalline organic semiconductor material to be anisotropically aligned in a specific direction.

6. The organic semiconductor structure according to claim 5, wherein said liquid crystal aligning layer is formed of a polyimide material.

7. The organic semiconductor structure according to claim 5, wherein said liquid crystal aligning layer is formed of a cured resin having fine concaves and convexes on its surface.

8. The organic semiconductor structure according to claim 5, wherein said liquid crystal aligning layer comprises a cured resin which has fine concaves and convexes on its surface and functions also as a substrate.

9. An organic semiconductor device comprising a substrate, a gate electrode, a gate insulating layer, an organic semiconductor layer, a drain electrode, and a source electrode,
said organic semiconductor layer comprising a liquid crystalline organic semiconductor material having a core comprising L 6 $\pi$ electron rings, M 8 $\pi$ electron rings, N 10 $\pi$ electron rings, O 12 $\pi$ electron rings, P 14 $\pi$ electron rings, Q 16 $\pi$ electron rings, R 18 $\pi$ electron rings, S 20 $\pi$ electron rings, T 22 $\pi$ electron rings, U 24 $\pi$ electron rings, and V 26 $\pi$ electron rings, wherein L, M, N, O, P, Q, R, S, T, U, and V are each an integer of 0 (zero) to 6 and L+M+N+O+P+Q+R+S+T+U+V=1 to 6.

10. The organic semiconductor device according to claim 9, wherein organic liquid crystalline molecules constituting said liquid crystalline organic semiconductor material are aligned in a direction orthogonal to the film thickness direction of a drain electrode and a source electrode provided on the gate insulating layer, and so as to be transversely arranged between the drain electrode and the source electrode.

11. The organic semiconductor device according to claim 9, wherein organic liquid crystalline molecules constituting said liquid crystalline organic semiconductor material are aligned in parallel with the film thickness direction of a drain electrode and a source electrode provided on the gate insulating layer.

12. The organic semiconductor device according to any one of claims 9 to 11, wherein said liquid crystalline organic semiconductor material has smectic liquid crystallinity at a predetermined temperature below the heat decomposition temperature of said liquid crystalline organic semiconductor material and has a charge mobility of not less than $10^{-5}$ cm$^2$/V·s or a hole transport mobility of not less than $10^{-5}$ cm$^2$/V·s.

* * * * *